United States Patent
Micheloni

(10) Patent No.: US 9,899,092 B2
(45) Date of Patent: Feb. 20, 2018

(54) NONVOLATILE MEMORY SYSTEM WITH PROGRAM STEP MANAGER AND METHOD FOR PROGRAM STEP MANAGEMENT

(71) Applicant: IP GEM GROUP, LLC, Irvine, CA (US)

(72) Inventor: Rino Micheloni, Turate (IT)

(73) Assignee: IP GEM GROUP, LLC, Irvine, CA (US)

( * ) Notice: Subject to any disclaimer, the term of this patent is extended or adjusted under 35 U.S.C. 154(b) by 0 days.

(21) Appl. No.: 15/042,125

(22) Filed: Feb. 11, 2016

(65) Prior Publication Data

US 2017/0213597 A1     Jul. 27, 2017

Related U.S. Application Data

(60) Provisional application No. 62/287,570, filed on Jan. 27, 2016.

(51) Int. Cl.
| | |
|---|---|
| G11C 11/34 | (2006.01) |
| G11C 16/14 | (2006.01) |
| G11C 16/10 | (2006.01) |
| G11C 16/26 | (2006.01) |

(52) U.S. Cl.
CPC .............. *G11C 16/14* (2013.01); *G11C 16/10* (2013.01); *G11C 16/26* (2013.01)

(58) Field of Classification Search
CPC .......... G11C 16/14; G11C 16/10; G11C 16/26
USPC ..................................................... 365/185.17
See application file for complete search history.

(56) References Cited

U.S. PATENT DOCUMENTS

| | | |
|---|---|---|
| 815,137 A | 3/1906 | Beecher |
| 5,615,235 A | 3/1997 | Kakuishi et al. |
| 5,732,092 A | 3/1998 | Shinohara |
| 5,822,244 A | 10/1998 | Hansen et al. |
| 5,875,343 A | 2/1999 | Binford et al. |
| 6,115,788 A | 9/2000 | Thowe |
| 6,148,360 A | 11/2000 | Leak et al. |
| 6,412,041 B1 | 6/2002 | Lee et al. |
| 6,539,515 B1 | 3/2003 | Gong |
| 6,567,313 B2 | 5/2003 | Tanaka et al. |

(Continued)

OTHER PUBLICATIONS

Chen, et al., "Increasing flash memory lifetime by dynamic voltage allocation for constant mutual information", 2014 Information Theory and Applications Workshop (ITA), 2014, pp. 1-5.

(Continued)

*Primary Examiner* — Anthan Tran
(74) *Attorney, Agent, or Firm* — Glass & Associates; Kenneth Glass

(57) ABSTRACT

A Solid State Drive (SSD) that includes a host connector receptacle for connecting to a host computer, a plurality of NAND devices and a nonvolatile memory controller. The nonvolatile memory controller is configured to perform program operations and read operations on memory cells of each of the NAND devices. The nonvolatile memory controller includes a program step circuit configured to initially program memory cells of each of the NAND devices using an initial program step voltage and is configured to change the program step voltage used to program the memory cells of each of the NAND devices during the lifetime of each of the NAND devices.

14 Claims, 8 Drawing Sheets

(56) References Cited

U.S. PATENT DOCUMENTS

| | | |
|---|---|---|
| 6,633,856 B2 | 10/2003 | Richardson et al. |
| 6,725,409 B1 | 4/2004 | Wolf |
| 6,789,227 B2 | 9/2004 | De Souza et al. |
| 6,871,168 B1 | 3/2005 | Tanaka et al. |
| 6,895,547 B2 | 5/2005 | Eleftheriou et al. |
| 6,934,804 B2 | 8/2005 | Hashemi |
| 6,963,507 B2 | 11/2005 | Tanaka et al. |
| 6,976,194 B2 | 12/2005 | Cypher |
| 6,976,197 B2 | 12/2005 | Faust et al. |
| 7,032,081 B1 | 4/2006 | Gefen et al. |
| 7,050,334 B2 | 5/2006 | Kim et al. |
| 7,116,732 B2 | 10/2006 | Worm et al. |
| 7,206,992 B2 | 4/2007 | Xin et al. |
| 7,209,527 B2 | 4/2007 | Smith et al. |
| 7,237,183 B2 | 6/2007 | Xin |
| 7,324,559 B2 | 1/2008 | McGibney |
| 7,376,015 B2 | 5/2008 | Tanaka et al. |
| 7,450,668 B2 | 11/2008 | Ghosh et al. |
| 7,457,906 B2 | 11/2008 | Pettey et al. |
| 7,472,331 B2 | 12/2008 | Kim et al. |
| 7,484,158 B2 | 1/2009 | Sharon et al. |
| 7,529,215 B2 | 5/2009 | Osterling |
| 7,567,472 B2 | 7/2009 | Gatzemeier et al. |
| 7,620,784 B2 | 11/2009 | Panabaker et al. |
| 7,650,480 B2 | 1/2010 | Jiang et al. |
| 7,694,047 B1 | 4/2010 | Alston |
| 7,708,195 B2 | 5/2010 | Yoshida et al. |
| 7,739,472 B2 | 6/2010 | Guterman et al. |
| 7,752,346 B2 | 7/2010 | Talayco et al. |
| 7,801,233 B1 | 9/2010 | Chow et al. |
| 7,860,930 B2 | 12/2010 | Freimuth et al. |
| 7,904,793 B2 | 3/2011 | Mokhlesi et al. |
| 7,937,641 B2 | 5/2011 | Amidi |
| 7,945,721 B1 | 5/2011 | Johnsen et al. |
| 7,958,430 B1 | 6/2011 | Kolokowsky et al. |
| 7,975,193 B2 | 7/2011 | Johnson |
| 8,094,508 B2 | 1/2012 | Gatzemeier et al. |
| 8,140,930 B1 | 3/2012 | Maru |
| 8,176,367 B2 | 5/2012 | Dreifus et al. |
| 8,219,894 B2 | 7/2012 | Au et al. |
| 8,223,745 B2 | 7/2012 | Johnsen et al. |
| 8,228,728 B1 | 7/2012 | Yang et al. |
| 8,244,946 B2 | 8/2012 | Gupta et al. |
| 8,245,112 B2 | 8/2012 | Hicken et al. |
| 8,245,117 B1 | 8/2012 | Wu |
| 8,250,286 B2 | 8/2012 | Yeh et al. |
| 8,254,112 B2 | 8/2012 | Yang et al. |
| 8,255,770 B2 | 8/2012 | Park et al. |
| 8,259,498 B2 | 9/2012 | Yogev et al. |
| 8,259,506 B1 | 9/2012 | Sommer et al. |
| 8,261,136 B2 | 9/2012 | D'Abreu et al. |
| 8,281,217 B2 | 10/2012 | Kim et al. |
| 8,281,227 B2 | 10/2012 | Inskeep et al. |
| 8,286,004 B2 | 10/2012 | Williams |
| 8,307,258 B2 | 11/2012 | Flynn et al. |
| 8,327,220 B2 | 12/2012 | Borchers et al. |
| 8,335,977 B2 | 12/2012 | Weingarten et al. |
| 8,341,502 B2 | 12/2012 | Steiner et al. |
| 8,351,258 B1 | 1/2013 | Yang et al. |
| 8,359,522 B2 | 1/2013 | Gunnam et al. |
| 8,392,789 B2 | 3/2013 | Biscondi et al. |
| 8,402,201 B2 | 3/2013 | Strasser et al. |
| 8,418,023 B2 | 4/2013 | Gunnam et al. |
| 8,429,325 B1 | 4/2013 | Onufryk et al. |
| 8,429,497 B2 | 4/2013 | Tu et al. |
| 8,473,812 B2 | 6/2013 | Ramamoorthy et al. |
| 8,493,791 B2 | 7/2013 | Karakulak et al. |
| 8,504,885 B2 | 8/2013 | Haratsch et al. |
| 8,504,887 B1 | 8/2013 | Varnica et al. |
| 8,555,140 B2 | 10/2013 | Gunnam et al. |
| 8,621,318 B1 | 12/2013 | Micheloni et al. |
| 8,638,602 B1 | 1/2014 | Horn et al. |
| 8,640,005 B2 | 1/2014 | Wilkerson et al. |
| 8,645,613 B2 | 2/2014 | Tan et al. |
| 8,656,257 B1 | 2/2014 | Micheloni et al. |
| 8,694,849 B1 | 4/2014 | Micheloni et al. |
| 8,694,855 B1 | 4/2014 | Micheloni et al. |
| 8,706,956 B2 | 4/2014 | Cagno et al. |
| 8,707,122 B1 | 4/2014 | Micheloni et al. |
| 8,737,141 B2 | 5/2014 | Melik-Martirosian |
| 8,739,008 B2 | 5/2014 | Liu et al. |
| 8,755,229 B1 | 6/2014 | Beltrami et al. |
| 8,762,620 B2 | 6/2014 | Prins et al. |
| 8,769,374 B2 | 7/2014 | Franceschini et al. |
| 8,775,913 B2 | 7/2014 | Haratsch et al. |
| 8,787,428 B2 | 7/2014 | Dai et al. |
| 8,856,622 B2 | 10/2014 | Ramamoorthy et al. |
| 8,898,372 B2 | 11/2014 | Yeh |
| 8,917,734 B1 | 12/2014 | Brown |
| 8,924,824 B1 | 12/2014 | Lu |
| 8,953,373 B1 | 2/2015 | Haratsch et al. |
| 8,958,247 B2 | 2/2015 | Asaoka et al. |
| 8,959,280 B2 | 2/2015 | Yu et al. |
| 8,984,216 B2 | 3/2015 | Fillingim |
| 8,995,197 B1 | 3/2015 | Steiner et al. |
| 8,995,302 B1 | 3/2015 | Brown et al. |
| 9,025,495 B1 | 5/2015 | Onufryk et al. |
| 9,058,289 B2 | 6/2015 | Tai et al. |
| 9,142,314 B2 | 9/2015 | Beltrami et al. |
| 9,164,891 B2 | 10/2015 | Karamcheti et al. |
| 9,244,763 B1 | 1/2016 | Kankani et al. |
| 9,251,909 B1 | 2/2016 | Camp et al. |
| 9,257,182 B2 | 2/2016 | Grunzke |
| 9,294,132 B1 | 3/2016 | Peleato-Inarrea |
| 2002/0051501 A1 | 5/2002 | Demjanenko et al. |
| 2002/0129308 A1 | 9/2002 | Kinoshita et al. |
| 2002/0181438 A1 | 12/2002 | McGibney |
| 2003/0033567 A1 | 2/2003 | Tamura et al. |
| 2003/0104788 A1 | 6/2003 | Kim |
| 2003/0225970 A1 | 12/2003 | Hashemi |
| 2004/0088636 A1 | 5/2004 | Cypher |
| 2004/0123230 A1 | 6/2004 | Lee et al. |
| 2004/0136236 A1 | 7/2004 | Cohen et al. |
| 2004/0181735 A1 | 9/2004 | Xin |
| 2004/0234150 A1 | 11/2004 | Chang |
| 2004/0252791 A1 | 12/2004 | Shen et al. |
| 2004/0268015 A1 | 12/2004 | Pettey et al. |
| 2005/0010846 A1 | 1/2005 | Kikuchi et al. |
| 2005/0226355 A1 | 10/2005 | Kibune et al. |
| 2005/0248999 A1 | 11/2005 | Tamura et al. |
| 2005/0252791 A1 | 11/2005 | Pechtold et al. |
| 2005/0286511 A1 | 12/2005 | Johnsen et al. |
| 2006/0039370 A1 | 2/2006 | Rosen et al. |
| 2006/0050694 A1 | 3/2006 | Bury et al. |
| 2006/0126728 A1 | 6/2006 | Yu et al. |
| 2006/0206655 A1 | 9/2006 | Chappell et al. |
| 2006/0282603 A1 | 12/2006 | Onufryk et al. |
| 2007/0050688 A1 | 3/2007 | Thayer |
| 2007/0089031 A1 | 4/2007 | Huffman et al. |
| 2007/0101225 A1 | 5/2007 | Moon et al. |
| 2007/0118743 A1 | 5/2007 | Thornton et al. |
| 2007/0136628 A1 | 6/2007 | Doi et al. |
| 2007/0147489 A1 | 6/2007 | Sun et al. |
| 2007/0217253 A1 | 9/2007 | Kim et al. |
| 2007/0233939 A1 | 10/2007 | Kim |
| 2007/0239926 A1 | 10/2007 | Gyl et al. |
| 2008/0005382 A1 | 1/2008 | Mimatsu |
| 2008/0016425 A1 | 1/2008 | Khan et al. |
| 2008/0049869 A1 | 2/2008 | Heinrich et al. |
| 2008/0077843 A1 | 3/2008 | Cho et al. |
| 2008/0148129 A1 | 6/2008 | Moon et al. |
| 2008/0229079 A1 | 9/2008 | Flynn et al. |
| 2008/0229164 A1 | 9/2008 | Tamura et al. |
| 2008/0256280 A1 | 10/2008 | Ma |
| 2008/0256292 A1 | 10/2008 | Flynn et al. |
| 2008/0263265 A1 | 10/2008 | Litsyn et al. |
| 2008/0267081 A1 | 10/2008 | Roeck |
| 2008/0276156 A1 | 11/2008 | Gunnam et al. |
| 2008/0320214 A1 | 12/2008 | Ma et al. |
| 2009/0027991 A1 | 1/2009 | Kaizu et al. |
| 2009/0067320 A1 | 3/2009 | Rosenberg et al. |
| 2009/0077302 A1 | 3/2009 | Fukuda |
| 2009/0164694 A1 | 6/2009 | Talayco et al. |
| 2009/0290441 A1 | 11/2009 | Gatzemeier et al. |

(56) References Cited

U.S. PATENT DOCUMENTS

| | | | |
|---|---|---|---|
| 2009/0296798 A1 | 12/2009 | Banna et al. | |
| 2009/0303788 A1 | 12/2009 | Roohparvar et al. | |
| 2009/0307412 A1 | 12/2009 | Yeh et al. | |
| 2009/0327802 A1 | 12/2009 | Fukutomi et al. | |
| 2010/0085076 A1 | 4/2010 | Danilin et al. | |
| 2010/0162075 A1 | 6/2010 | Brannstrom et al. | |
| 2010/0185808 A1 | 7/2010 | Yu et al. | |
| 2010/0199149 A1 | 8/2010 | Weingarten et al. | |
| 2010/0211737 A1 | 8/2010 | Flynn et al. | |
| 2010/0211852 A1 | 8/2010 | Lee et al. | |
| 2010/0226422 A1 | 9/2010 | Taubin et al. | |
| 2010/0246664 A1 | 9/2010 | Citta et al. | |
| 2010/0262979 A1 | 10/2010 | Borchers et al. | |
| 2010/0293440 A1 | 11/2010 | Thatcher et al. | |
| 2011/0010602 A1 | 1/2011 | Chung et al. | |
| 2011/0055453 A1 | 3/2011 | Bennett et al. | |
| 2011/0055659 A1 | 3/2011 | Tu et al. | |
| 2011/0066902 A1 | 3/2011 | Sharon et al. | |
| 2011/0072331 A1 | 3/2011 | Sakaue et al. | |
| 2011/0119553 A1 | 5/2011 | Gunnam et al. | |
| 2011/0161678 A1 | 6/2011 | Niwa | |
| 2011/0209031 A1 | 8/2011 | Kim et al. | |
| 2011/0225341 A1 | 9/2011 | Satoh et al. | |
| 2011/0246136 A1 | 10/2011 | Haratsch et al. | |
| 2011/0246842 A1 | 10/2011 | Haratsch et al. | |
| 2011/0246853 A1 | 10/2011 | Kim et al. | |
| 2011/0296084 A1 | 12/2011 | Nango | |
| 2011/0307758 A1 | 12/2011 | Fillingim et al. | |
| 2012/0008396 A1 | 1/2012 | Park et al. | |
| 2012/0051144 A1 | 3/2012 | Weingarten et al. | |
| 2012/0054413 A1 | 3/2012 | Brandt | |
| 2012/0096192 A1 | 4/2012 | Tanaka et al. | |
| 2012/0140583 A1 | 6/2012 | Chung et al. | |
| 2012/0141139 A1 | 6/2012 | Bakhru et al. | |
| 2012/0166690 A1 | 6/2012 | Regula | |
| 2012/0167100 A1 | 6/2012 | Li et al. | |
| 2012/0179860 A1 | 7/2012 | Falanga et al. | |
| 2012/0203986 A1 | 8/2012 | Strasser et al. | |
| 2012/0239991 A1 | 9/2012 | Melik-Martirosian et al. | |
| 2012/0254515 A1 | 10/2012 | Melik-Martirosian et al. | |
| 2012/0311388 A1 | 12/2012 | Cronin et al. | |
| 2012/0311402 A1 | 12/2012 | Tseng et al. | |
| 2013/0013983 A1 | 1/2013 | Livshitz et al. | |
| 2013/0024735 A1* | 1/2013 | Chung | G06F 11/1048 714/704 |
| 2013/0060994 A1 | 3/2013 | Higgins et al. | |
| 2013/0086451 A1 | 4/2013 | Grube et al. | |
| 2013/0094286 A1 | 4/2013 | Sridharan et al. | |
| 2013/0094290 A1 | 4/2013 | Sridharan et al. | |
| 2013/0117616 A1 | 5/2013 | Tai et al. | |
| 2013/0117640 A1 | 5/2013 | Tai et al. | |
| 2013/0145235 A1 | 6/2013 | Alhussien et al. | |
| 2013/0163327 A1 | 6/2013 | Karakulak et al. | |
| 2013/0163328 A1 | 6/2013 | Karakulak et al. | |
| 2013/0176779 A1 | 7/2013 | Chen et al. | |
| 2013/0185598 A1 | 7/2013 | Haratsch et al. | |
| 2013/0198451 A1 | 8/2013 | Hyun et al. | |
| 2013/0205085 A1 | 8/2013 | Hyun et al. | |
| 2013/0314988 A1 | 11/2013 | Desireddi et al. | |
| 2013/0315252 A1 | 11/2013 | Emmadi et al. | |
| 2013/0318422 A1 | 11/2013 | Weathers et al. | |
| 2014/0029336 A1 | 1/2014 | Venkitachalam et al. | |
| 2014/0040704 A1 | 2/2014 | Wu et al. | |
| 2014/0053037 A1 | 2/2014 | Wang et al. | |
| 2014/0068368 A1 | 3/2014 | Zhang et al. | |
| 2014/0068382 A1 | 3/2014 | Desireddi et al. | |
| 2014/0072056 A1 | 3/2014 | Fay | |
| 2014/0085982 A1 | 3/2014 | Asaoka et al. | |
| 2014/0101510 A1 | 4/2014 | Wang et al. | |
| 2014/0164881 A1 | 6/2014 | Chen et al. | |
| 2014/0181426 A1 | 6/2014 | Grunzke et al. | |
| 2014/0181617 A1 | 6/2014 | Wu et al. | |
| 2014/0185611 A1 | 7/2014 | Lie et al. | |
| 2014/0198569 A1 | 7/2014 | Kim et al. | |
| 2014/0198581 A1 | 7/2014 | Kim et al. | |
| 2014/0215175 A1 | 7/2014 | Kasorla et al. | |
| 2014/0219003 A1 | 8/2014 | Ebsen et al. | |
| 2014/0229774 A1 | 8/2014 | Melik-Martirosian et al. | |
| 2014/0281767 A1 | 9/2014 | Alhussien et al. | |
| 2014/0281771 A1 | 9/2014 | Yoon et al. | |
| 2014/0281808 A1 | 9/2014 | Lam et al. | |
| 2014/0281822 A1 | 9/2014 | Wu et al. | |
| 2014/0281823 A1 | 9/2014 | Micheloni et al. | |
| 2015/0039952 A1 | 2/2015 | Goessel et al. | |
| 2015/0043286 A1 | 2/2015 | Park et al. | |
| 2015/0046625 A1 | 2/2015 | Peddle et al. | |
| 2015/0127883 A1 | 5/2015 | Chen et al. | |
| 2015/0131373 A1* | 5/2015 | Alhussien | G11C 16/3431 365/185.02 |
| 2015/0149871 A1 | 5/2015 | Chen et al. | |
| 2015/0169468 A1 | 6/2015 | Camp et al. | |
| 2015/0186055 A1 | 7/2015 | Darragh | |
| 2015/0221381 A1 | 8/2015 | Nam | |
| 2015/0242268 A1 | 8/2015 | Wu et al. | |
| 2015/0332780 A1 | 11/2015 | Kim et al. | |
| 2015/0371718 A1 | 12/2015 | Becker et al. | |
| 2016/0034206 A1 | 2/2016 | Ryan et al. | |
| 2016/0049203 A1 | 2/2016 | Alrod et al. | |
| 2016/0071601 A1* | 3/2016 | Shirakawa | G11C 16/08 711/122 |
| 2016/0155507 A1 | 6/2016 | Grunzke | |
| 2016/0179406 A1 | 6/2016 | Gorobets et al. | |
| 2016/0293259 A1* | 10/2016 | Kim | G11C 16/08 |
| 2017/0213597 A1 | 7/2017 | Micheloni et al. | |

OTHER PUBLICATIONS

Peleato, et al., "Probabilistic graphical model for flash memory programming", Statistical Signal Processing Workshop (SSP), 2012 IEEE, 2012, pp. 1-4, Electrical Engineering Dept, Stanford University, Palo Alto, CA, USA.

NVM Express, Revision 1.0; Intel Corporation; Mar. 1, 2011.

NVM Express, revision 1.0; Intel Corporation; pp. 103-106 and 110-114; Jul. 12, 2011.

Cai, et al., "Data Retention in MLC NAND Flash Memory: Characterization, Optimization, and Recovery", 2015 IEEE 21st International Symposium on High Performance Computer Architecture (HPCA); Carnegie Mellon University, LSI Corporation, 2015, pp. 551-563.

Wu, et al., "Reducing SSD Read Latency via NAND Flash Program and Erase Suspension", Proceedings of FAST'2012; Department of Electrical and Computer Engineering Virginia Commonwealth University, Richmond, VA 23284, 2012, pp. 117-123.

\* cited by examiner

NONVOLATILE MEMORY SYSTEM WITH PROGRAM STEP MANAGER AND METHOD FOR PROGRAM STEP MANAGEMENT

BACKGROUND

Nonvolatile memory manufacturers such as manufacturers of NAND flash memory devices typically specify a fixed program step voltage that is used for programming of cells of NAND flash memory devices that they manufacture and the program step voltage does not change during the lifetime of the NAND flash memory device. Memory controllers couple to NAND flash memory devices and control the operation of the NAND flash memory devices for storing data on the NAND flash memory devices and reading data from the NAND flash memory devices.

For devices such as Solid State Drives (SSD's) it is important to constantly improve data storage time and data read time to have the best possible SSD specifications. As the number of bits in each NAND memory cell has increased the threshold voltage window of the programming operation has become more limited. In Triple Level Cell (TLC) NAND flash memory devices eight voltage distributions are required to store three bits of information. To achieve the limited threshold voltage window NAND manufacturers typically use a fixed program step voltage that is relatively low, requiring numerous programming pulses to perform each program operation. This has a negative effect on programming time and therefore negatively affects the throughput and Input/Output Operations Per Second (IOPS) of the SSD.

In addition, the numerous programming pulses negatively affect the raw Bit Error Rate (BER) of the NAND flash memory devices, reducing the life span of the NAND flash memory devices. This correspondingly decreases the lifespan of the SSD.

Accordingly there is a need for a method and apparatus that will extend the life span of NAND flash memory devices and that will reduce program time.

SUMMARY

A nonvolatile memory controller is disclosed that is configured to perform program operations and read operations on memory cells of a NAND device. The nonvolatile memory controller includes a program step circuit configured to initially program memory cells of the NAND device using an initial program step voltage and configured to change the program step voltage used to program the memory cells of the NAND device during the lifetime of the NAND device.

A Solid State Drive (SSD) is disclosed that includes a host connector receptacle for connecting to a host computer, a plurality of NAND devices and a nonvolatile memory controller coupled to the host connector receptacle and coupled to each of the plurality of NAND devices. The nonvolatile memory controller is configured to perform program operations and read operations on memory cells of each of the NAND devices in the plurality of NAND devices. The nonvolatile memory controller includes a program step circuit configured to initially program memory cells of each of the NAND devices in the plurality of NAND devices using an initial program step voltage and is configured to change the program step voltage used to program the memory cells of each of the NAND devices in the plurality of NAND devices during the lifetime of each of the NAND devices.

A method for programming a memory cell of a NAND device is disclosed that includes loading trim registers of a NAND device with an initial program step voltage and performing program operations of the NAND device using the initial step voltage. The method includes determining whether a characteristic of the NAND device has met a characteristic threshold and if the characteristic has met the characteristic threshold, loading a different program step voltage into the trim registers of the NAND device. Program operations of the NAND device are then performed using the different program step voltage. The process of determining whether a characteristic of the NAND device has met a characteristic threshold and the loading a different program step voltage into the trim registers of the NAND device if the characteristic has met the characteristic threshold is continued for the lifetime of the NAND device.

Because the higher program step voltage results in fewer program pulses to memory cells of the NAND flash memory device, the methods and apparatus of the present invention decrease program time and extend the lifespan of the NAND flash memory device.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DETAILED DESCRIPTION

Figure 1:
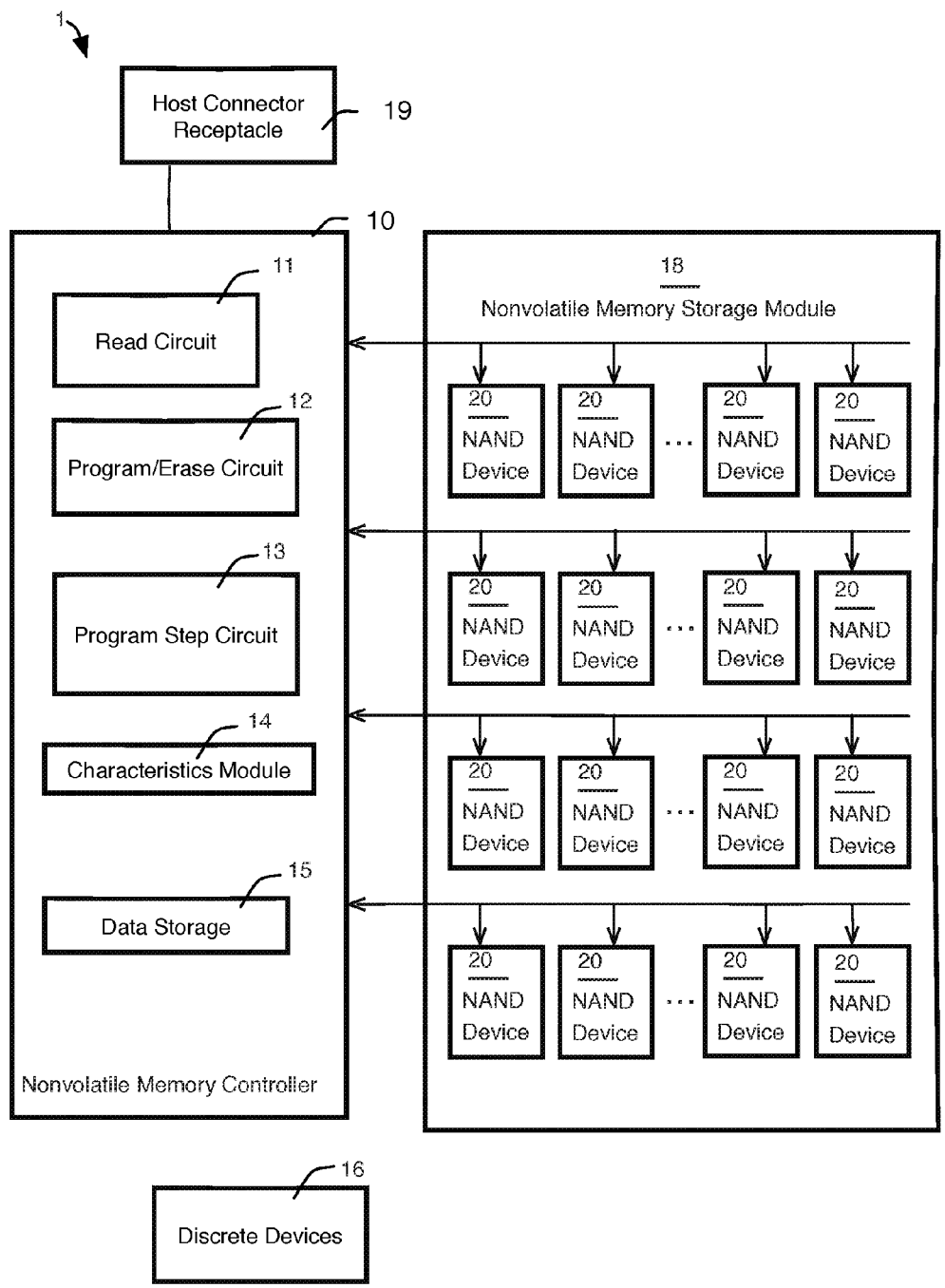
FIG. 1 is a block diagram illustrating a Solid State Drive (SSD) in accordance with an embodiment of the present invention.

FIG. 1 shows a Solid State Drive (SSD) 1 that includes a host connector receptacle 19 for connecting to a host computer, a nonvolatile memory storage module 18 that includes a plurality of NAND devices 20, and a nonvolatile memory controller 10. Nonvolatile memory controller 10 is electrically connected to the host connector receptacle 19 and electrically connected to each of NAND devices 20. Nonvolatile memory controller 10 includes program and erase circuit 12 configured to perform program operations on memory cells of each NAND device 20 and read circuit 11 configured to perform read operations on memory cells of each NAND devices 20.

Nonvolatile memory controller 10 is configured to receive read and write instructions from a host computer through host connector receptacle 19 and to perform program operations, erase operations and read operations on memory cells of nonvolatile memory devices 20 to complete the instructions from the host computer. For example, upon receiving a write instruction from the host computer, memory controller 10 is operable to write data into nonvolatile memory storage module 18 by performing program operations (and when required, erase operations) on one or more NAND device 20, and upon receiving a read instruction nonvolatile memory controller 10 is operable to read data from nonvolatile memory storage module 18 by performing read operations on one or more NAND device 20.

Nonvolatile memory controller 10 includes a program step circuit 13 configured to initially program memory cells of each NAND device 20 using an initial program step voltage and configured to change the program step voltage used to program the memory cells of each NAND device 20 during the lifetime of each NAND devices 20, with each subsequent program step voltage lower than the previous program step voltage.

Nonvolatile memory controller 10 further includes a characteristics module 14 configured to determine one or more characteristic of each NAND devices 20. Program step circuit 13 is configured to change the program step voltage that is used to program the memory cells of each NAND device 20 to a different program step voltage that is lower than the initial program step voltage when the one or more characteristic of the NAND device 20 reaches a predetermined threshold.

In one embodiment the threshold is a program and erase cycle threshold. In this embodiment program step circuit 2 is configured to determine the number of program and erase cycles of the NAND device and change the program step voltage to the different program step voltage when the determined number of program and erase cycles of the NAND device reach the program and erase cycle threshold.

In one embodiment program step circuit 2 is configured to use a program/erase counter to determine the number of program and erase cycles of each block of the NAND device and change the program step voltage of each block to the different program step voltage when the determined number of program and erase cycles of the block of the NAND device reaches the program and erase cycle threshold.

In another embodiment the threshold is an error threshold. In this embodiment program step circuit 13 is configured to change the program step voltage to the different program step voltage when an error rate of the NAND device reaches the error threshold.

In yet another embodiment the threshold is an age threshold. In this embodiment program step circuit 13 is configured to change the program step voltage to the different program step voltage when the age of the NAND device reaches the age threshold. In one embodiment the age threshold is an average age of blocks of the NAND device. In one specific embodiment the average age of the NAND device is determined by calculating the average of the number of program and erase cycles for all blocks of the NAND device.

Characteristics module 14 is configured to determine characteristics of NAND devices 20. The characteristics may be stored in data storage 15 on nonvolatile memory controller 10 (e.g., registers or a memory array), or may be stored on one or more NAND device 20. NAND device 20 includes memory cells that are organized into blocks and pages, with each page composed of a main data area and a spare area. In one embodiment the determined usage characteristics are stored in the spare area of one or more page of NAND device 20.

The characteristics stored by characteristics module 14 may include characteristics that relate to how a particular NAND device 20 has been used, that may be referred to as "usage characteristics." The stored usage characteristics include the number of Program and Erase (P/E) cycles for each block of each NAND, which may be determined by incrementing a stored P/E value each time that a block is programmed and each time that the block is erased. Alternatively, program and erase values can be separately accounted for, by storing a program value each time that a block is programmed and storing a separate erase value that is incremented each time that the block is erased.

The characteristics stored by characteristics module 14 may include characteristics that indicate the performance of NAND device 20 that may be referred to hereinafter as "performance characteristics." The stored performance characteristics include test results from tests on each NAND device 20, which may include the number of read errors from the test (e.g., the total number of errors in each test block of memory cells that is read) and/or the number of errors of the page in the block having the highest number of errors, that may be referred to hereinafter as the "maximum number of errors" of the block. In one embodiment, characteristics module 14 includes an online test module configured to perform reads of memory cells of a NAND device during operation of the NAND device to determine the error rate of the NAND device. The error rate can be determined by reading one or more dedicated test block to determine a maximum number of errors in each dedicated test block, the determined maximum number of errors determined to be the Bit Error Rate (BER) of the NAND device.

In one exemplary embodiment, characteristics module 14 includes an online test module configured to perform reads of memory cells of a NAND device during operation of the NAND device to determine an error rate for each block of the NAND device, that can be referred to as the "block BER." When the block BER exceeds a block BER threshold, program step circuit 13 is configured to change the program step voltage for the block to the different program step voltage. In another embodiment the average BER is determined for some or all blocks, and program step circuit 13 is configured to change the program step voltage to the different program step voltage when the block BER exceeds a block BER threshold.

The characteristics stored by characteristics module 14 may include characteristics that indicate a condition of NAND device 20 that may be referred to hereinafter as "operating characteristics." Stored operating characteristics may include the temperature of NAND device 20, the maximum temperature of NAND device 20, etc. In one embodiment the maximum temperature of each NAND device is determined by measuring temperature of NAND device 20 at some interval and replacing the previously stored maximum temperature value with the measured temperature any time that the measured temperature exceeds the stored maximum temperature.

In one embodiment in which a temperature threshold is used, temperature is determined at the chip/package level and program step circuit 13 is configured to change the program step voltage of all blocks to the different program step voltage when the temperature of the NAND device reaches the temperature threshold.

The above thresholds are discussed individually. However, in embodiments of the present invention more than one different threshold can be used during the lifespan of each NAND device 20, either concurrently or sequentially. In this embodiment, the threshold or thresholds used can be programmable and can be changed during the lifespan of each NAND device 20.

In the present embodiment each NAND device 20 is a packaged semiconductor die that is coupled to nonvolatile memory controller 10 by conductive pathways that couple instructions, data and other information between each NAND device 20 and nonvolatile memory controller 10. In the embodiment shown in FIG. 2 each NAND device 20 is coupled to nonvolatile memory controller 10 by chip enable line (CE#), a command latch enable (CLE) line, a read enable signal line (RE#), an address latch enable (ALE) signal line, a write enable single line (WE#), a read/busy (R/B) signal line and input and output (DQ) signal lines. Each NAND device 20 includes a microcontroller 22, memory array 23 and registers 21 that are electrically connected to microcontroller 22. Memory array 23 includes memory cells that may be single level cell (SLC) multi-level cell (MLC), triple-level cell (TLC) or quadruple-level cell (QLC) memory devices.

Microcontroller 22 is in charge of managing all the internal operations, including programming, erasing and reading the memory cells of memory array 23. Registers 21 include registers used to store trim values, shown as trim registers 25. NAND algorithms are pretty complex and, therefore, it is necessary to keep them as flexible as possible, especially during product development. As such, a lot of trim registers 25 are used to trim parameters. More particularly, once the product development is done, trim registers 25 are used during manufacturing to adjust algorithms to account for the unavoidable die-to-die variation that is typical for volume production.

In embodiments of the present invention nonvolatile memory controller 10 includes state machine logic 26 that is operable for loading instructions and data in registers 21, 25 so as to create a state machine 27 between the circuitry of nonvolatile memory controller 10 and the circuitry of NAND device 20.

Program step circuit 13 and/or state machine logic 26 is configured to initially program memory cells of the NAND device 20 using an initial program step voltage by storing the initial program step voltage in one or more trim registers 25 and is configured to change the program step voltage used to program the memory cells of the NAND device 25 during the lifetime of the NAND device 25 by storing different program step voltages in trim registers 25.

Figure 3:
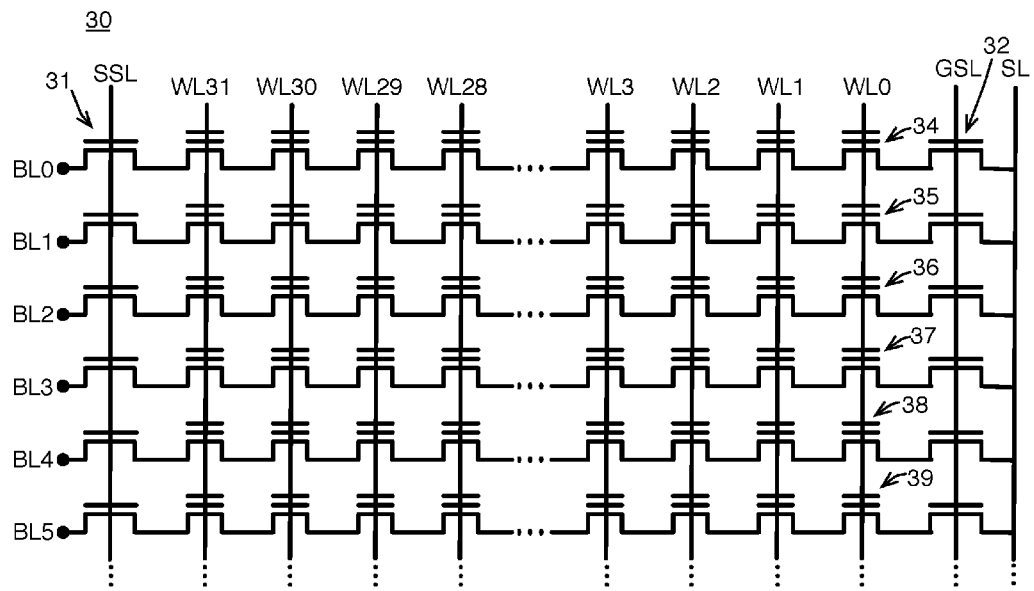
FIG. 3 is a diagram illustrating a NAND array in accordance with an embodiment of the present invention.

A memory array 30 is shown in FIG. 3 that is made of memory cells connected in series to form NAND strings. Each NAND string is isolated from the rest of the array by select transistors, such as, for example, select transistor 31 and select transistor 32. Multiple memory cells share the gate voltage (Vg) through a word line, and the drain of one memory cell is the source of the adjacent one. For example, memory cells 34-39 of FIG. 3 share word line 0 (WL0).

Figure 4:
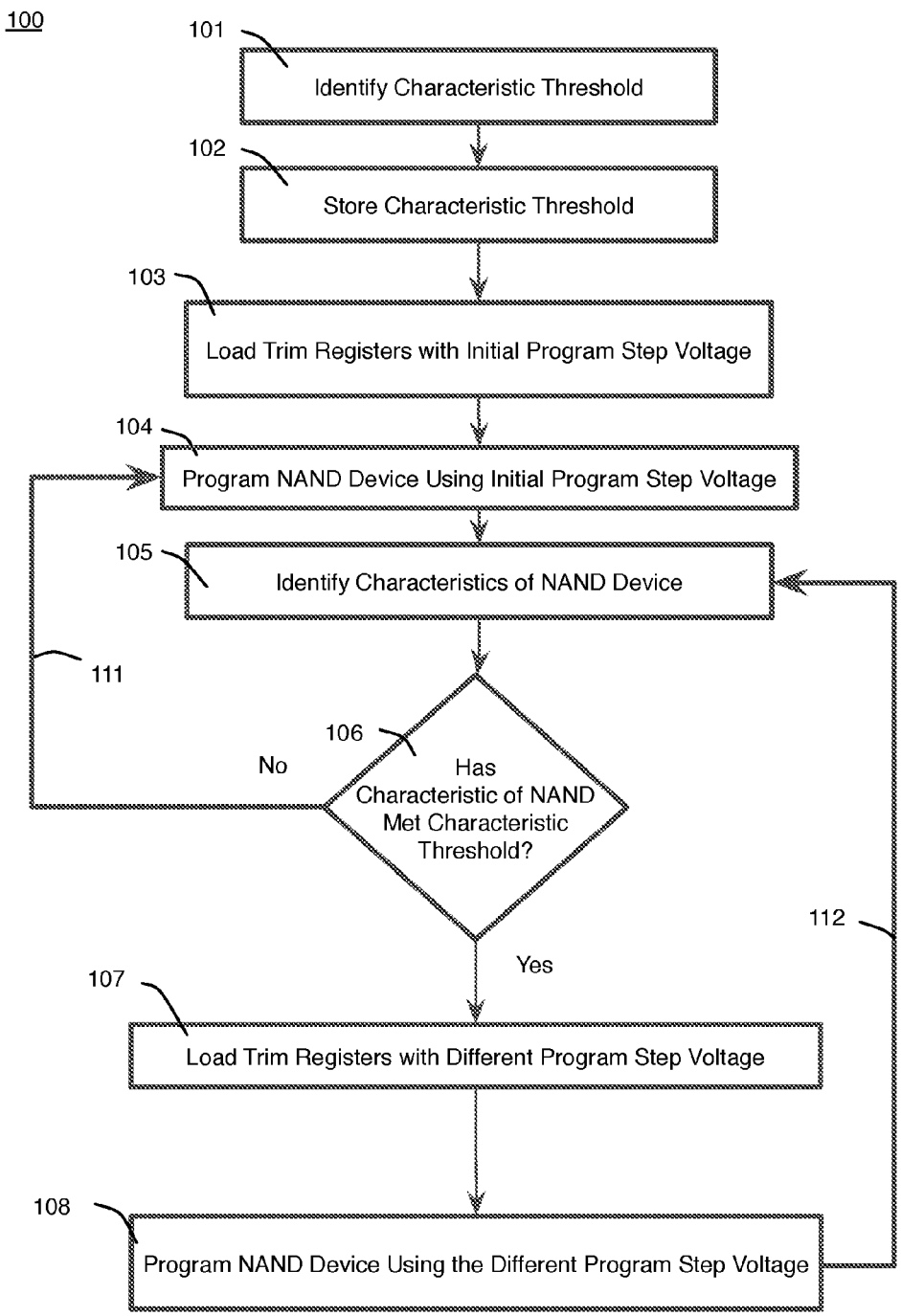
FIG. 4 is a flow diagram illustrating a method in accordance with an embodiment of the present invention.

FIG. 4 illustrates a method 100 for programming a memory cell of a NAND device in accordance with an embodiment of the present invention. As shown by step 101 a characteristic threshold is identified. The threshold can be determined by analyzing the characteristics of similar NAND devices in a test environment and the threshold can be stored 102 in data storage 15 or in one or more NAND device 20 prior to delivery of SSD 1 to a customer.

Trim registers of a NAND device are loaded 103 with an initial program step voltage. The initial program step voltage can be determined by analyzing the characteristics of similar NAND devices in a test environment and the threshold can be stored 102 in data storage 15 or in one or more NAND device 20 prior to delivery of SSD 1 to a customer.

Figure 2:
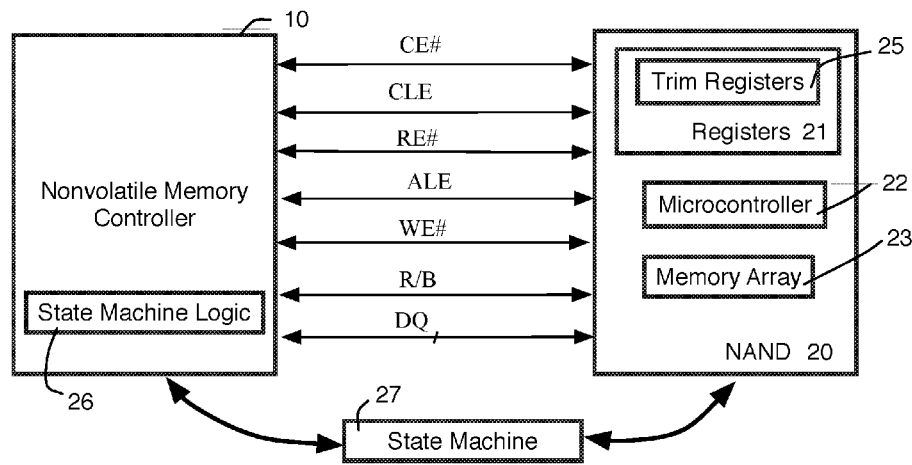
FIG. 2 is block diagram illustrating the connections between a nonvolatile memory controller and a NAND device in accordance with an embodiment of the present invention.

In the embodiment shown in FIG. 2 nonvolatile memory controller 10 is operable to modify the register setting used by the NAND internal microcontroller 22 to run the programming algorithm of method 100. For example, it can modify the incremental Step Programming Pulse ($\Delta V_{ISPP}$) of the NAND programming staircase shown in FIG. 5A. In essence, having the ability of reading and writing NAND registers is equivalent to being able to modify how Flash cells are written. Accordingly, in embodiments of the present invention, nonvolatile memory controller 10 is operable to write to registers 21, 25 of NAND 20 so as to control the operation of NAND 20, allowing for changing the program step voltage used by NAND 20.

Figure 5A:
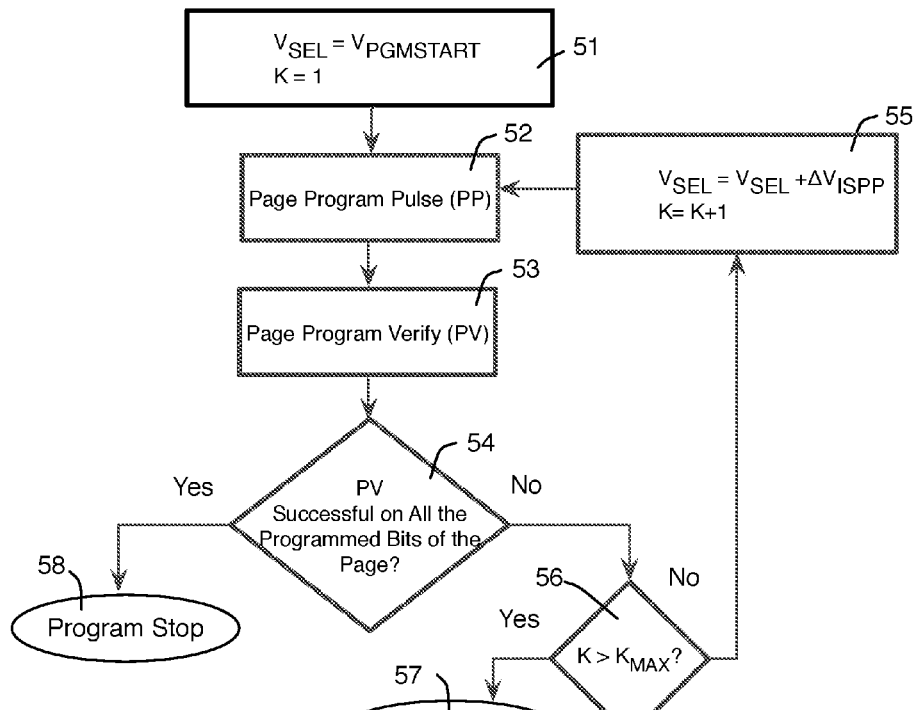
FIG. 5A is a diagram showing an exemplary program operation in accordance with an embodiment of the present invention.

Program operations of the NAND device are performed 104 using the initial program step voltage. FIG. 5A shows an exemplary program operation using a program start voltage ($V_{PGMSTART}$) and an incremental Step Programming Pulse (ISPP) having an initial program step voltage ($\Delta V_{ISPP}$). A first page program pulse (PP) is applied 51-52 to the gate of a cell to be programmed with a $V_{SEL}$ equal to the program start voltage, followed by a page program verify operation 53 in order to check if cell's $V_{TH}$ has exceeded a predefined voltage value ($V_{VFY}$). If the verify operation is successful, the cell has reached the desired state and it is excluded from the following program pulses 54, 58. Otherwise, another cycle of ISPP is applied to the cell using a program voltage that is incremented 55 by the initial program step voltage $\Delta V_{ISPP}$. This process continues until all cells have been programmed 58 or until a counter K exceeds a maximum ($K_{MAX}$) 56 and the program fails 57.

Figure 5B:
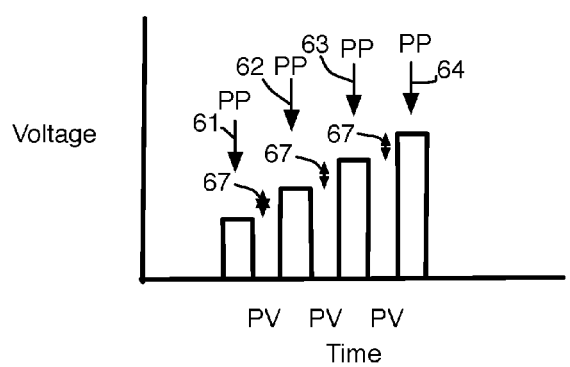
FIG. 5B is a chart showing voltage vs time, and illustrates a program operation in accordance with an embodiment of the present invention.

FIG. 5B shows an exemplary program operation using a program start voltage ($V_{PGMSTART}$) and an incremental Step Programming Pulse (ISPP) having an initial program step voltage ($\Delta V_{ISPP}$) 67. A first page program pulse (PP) 61 is applied to the gate of a cell to be programmed with a $V_{SEL}$ equal to the program start voltage, followed by a page program verify operation. If the verify operation is not successful, a second page program pulse (PP) 62 is applied to the gate of a cell to be programmed with a $V_{SEL}$ equal to the program start voltage plus $\Delta V_{ISPP}$ 67, followed by a program verify operation. If the verify operation is not successful, a third page program pulse (PP) 63 is applied to the gate of a cell to be programmed using a program voltage that is incremented by $\Delta V_{ISPP}$ 67, followed by a page program verify operation. If the verify operation is still not successful, a fourth page program pulse (PP) 64 is applied to the gate of a cell to be programmed using a program voltage that is incremented by $\Delta V_{ISPP}$ 67 followed by a page program verify operation.

One or more characteristic of the NAND device 20 is identified 105 and the identified characteristic(s) is compared to the character threshold stored in step 102 to determine 106 whether a characteristic of the NAND device 20 identified in step 105 has met the characteristic threshold. If the characteristic has not met the characteristic threshold the initial program step voltage continues to be used to program the NAND device 20 as shown by line 111. If the characteristic has met the characteristic threshold a different program step voltage is loaded into the trim registers of the NAND device 20 as shown by steps 106-107. Program operations of the NAND device 20 are performed 108 using the different program step voltage. Steps 105-108 continue as shown by line 112 during the lifetime of the NAND device 20.

In one embodiment the threshold is a Program and Erase (P/E) cycle threshold and in step 104 a different program step voltage is loaded into the trim registers of NAND device 20 when the determined number of program and erase cycles of NAND device 20 is greater than or equal to the P/E cycle threshold. In an embodiment in which the characteristic threshold is a P/E cycle threshold, characteristics module 14 is operable to perform step 105 by incrementing the number of program and erase cycles for each block each time that a program or erase operation is performed on that block and is operable to determine the total number of program and erase operations for NAND device 20 by summing the numbers for each block of the NAND device 20. This sum is then compared to the P/E cycle threshold in step 106.

Figure 5C:
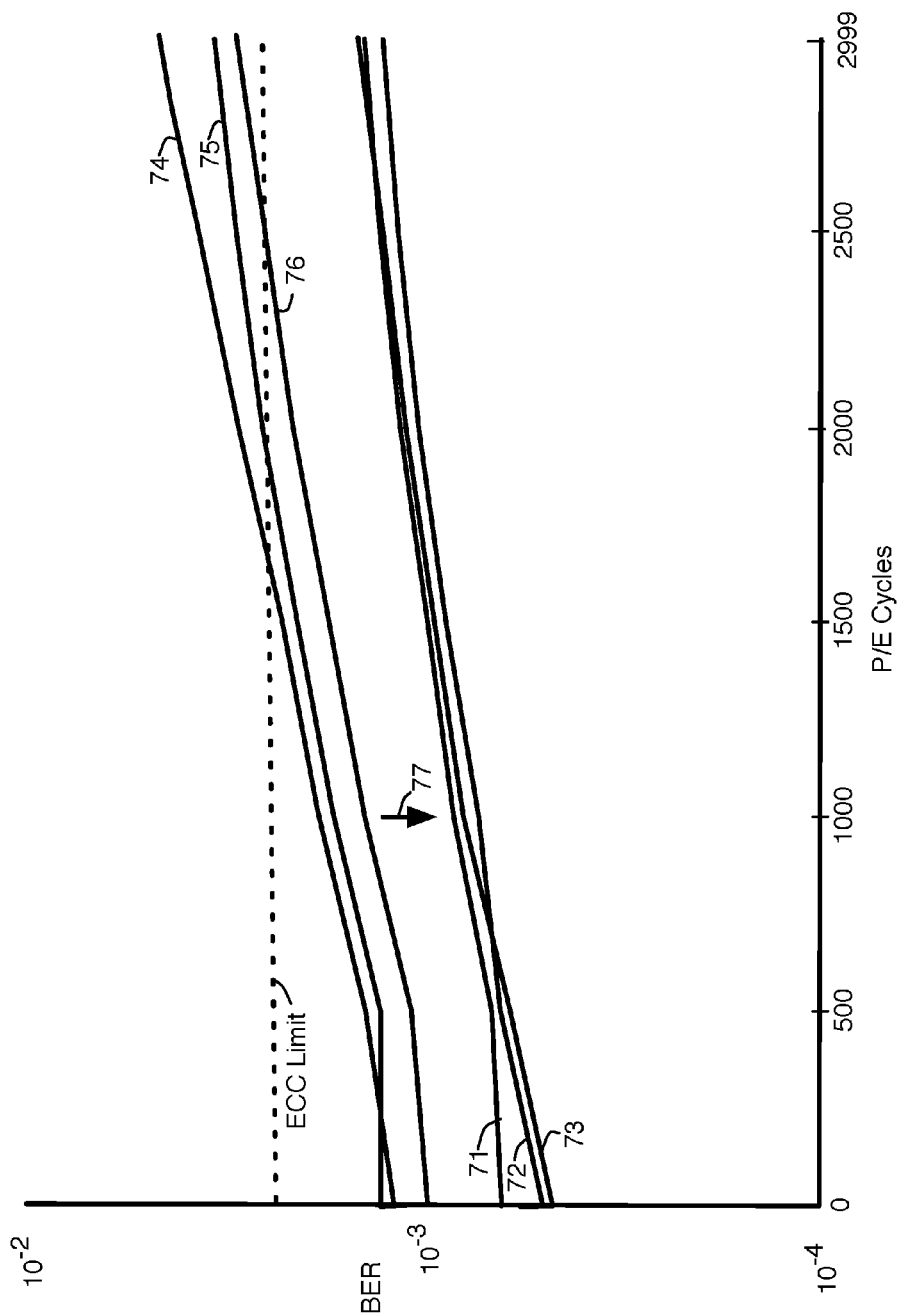
FIG. 5C is a chart of BER vs P/E cycles, and shows BER curves generated using an initial program step voltage that is higher than the program step voltage of the NAND device product specification as compared to BER curves generated using the program step voltage of the NAND product specification in accordance with an embodiment of the present invention.

FIG. 5C shows an analysis of the characteristics of NAND devices in a test environment to generate BER curves 74-76 using an exemplary initial program step voltage that is higher (e.g., double) the program step voltage in the NAND device product specification (the $\Delta V_{ISPP\text{-}SPEC}$) that is used in the prior art. The indicated ECC limit is the maximum number of errors that can be corrected by the error correction code used to code and decode data bits in NAND devices 20. The higher the programming step, the wider the $V_{TH}$ distribution is. If the $V_{TH}$ distribution gets larger, then the BER gets higher, because the distance to the adjacent distributions gets smaller. It can be seen that a higher program step voltage leads to a higher BER at the beginning of life as compared to the BER curves obtained 71-73 when the default $\Delta V_{ISPP\text{-}SPEC}$ programming is used. BER curve 74 is the BER curve for lower pages of test blocks, BER curve 75 is the BER curve for upper pages of test blocks, and BER curve 76 is the BER curve for middle pages of test blocks. This test data can be used to set a characteristic threshold 77 (e.g. 1,000 P/E cycles), thereby keeping the BER below the ECC limit and maintaining a margin (which is shown to be about 10% of the ECC limit) to make sure that the NAND devices 20 of SSD 1 do not exceed the ECC limit.

Figure 5D:
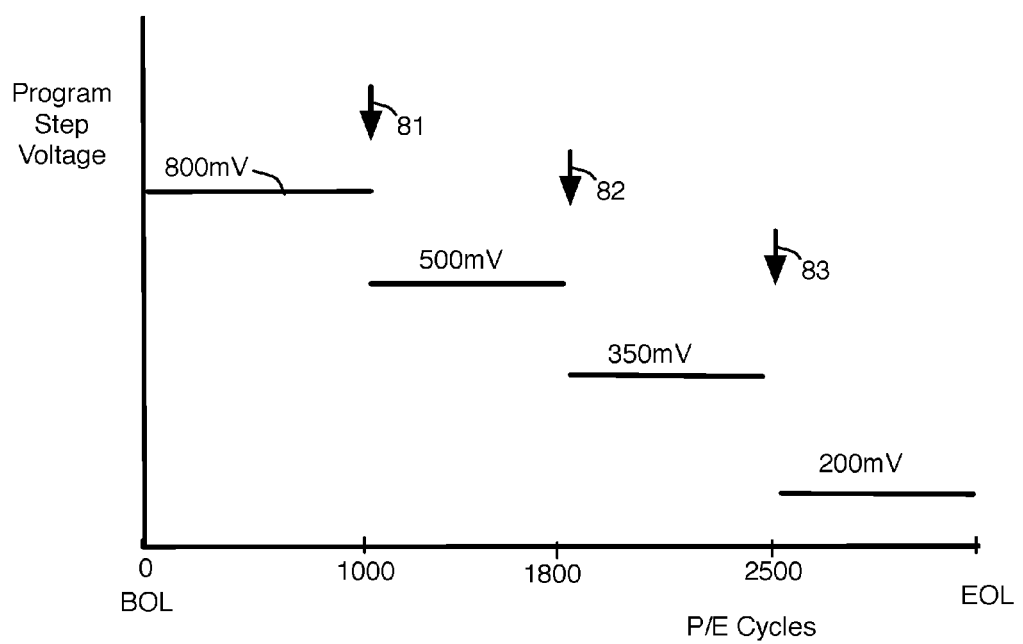
FIG. 5D is a chart of program step voltage vs P/E cycles, and illustrates program step voltage in accordance with an embodiment of the present invention.

In one exemplary embodiment that is shown in FIG. 5D, the characteristic threshold is the number of P/E cycles and the characteristic threshold is different for each program step voltage used. A first (initial) program step voltage of 800 mV and a first (initial) characteristic threshold of 1,000 P/E cycles; a second (different) program step voltage of 500 mV and a second characteristic threshold of 1,800 P/E cycles; a third (different) program step voltage of 350 mV and a third characteristic threshold of 2,500 P/E cycles; and a fourth (different) program step voltage of 200 mV, are determined in step 101 and stored in step 102. In this embodiment the initial program step voltage of 800 mV is double the $\Delta V_{ISPP\text{-}SPEC}$ of 400 mV of the NAND devices and decreases at each subsequent characteristic threshold to keep the BER below the ECC limit.

In one exemplary embodiment the identified characteristic is the BER of NAND device 20 and the characteristic threshold is a BER threshold. First, the BER threshold is determined 101 by analyzing the characteristics of similar NAND devices (e.g., the same manufacturer, the same device type, the same part number, and/or the same production batch) in a test environment and the BER threshold is stored 102 in data storage 15 prior to delivery of SSD 1 to a customer. The Bit Error Rate (BER) threshold is set at a number below the ECC limit and close to the ECC limit so that SSD 1 will have a fast read time, but not so close to the ECC limit so as to take the chance of having a read error. In one embodiment the BER threshold is set at 90% of the ECC limit. In this embodiment step 105 includes performing reads of test cells of NAND device 20 during operation of the NAND device 20 to determine the error rate of the NAND device 20. The error rate can be determined by reading one or more dedicated test block to determine a maximum number of errors in each dedicated test block, the determined maximum number of errors determined to be the BER of the NAND device 20. These tests can be performed at operating characteristic intervals such as, for example, P/E intervals (e.g., every 10, 50 or 100 P/E cycles), time intervals (e.g., once every operating day, week or month) etc. In this embodiment a different program step voltage is loaded 103 into the trim registers of the NAND device when the error rate of NAND device 20 is greater than or equal to the error threshold (BER threshold).

Figure 5E:
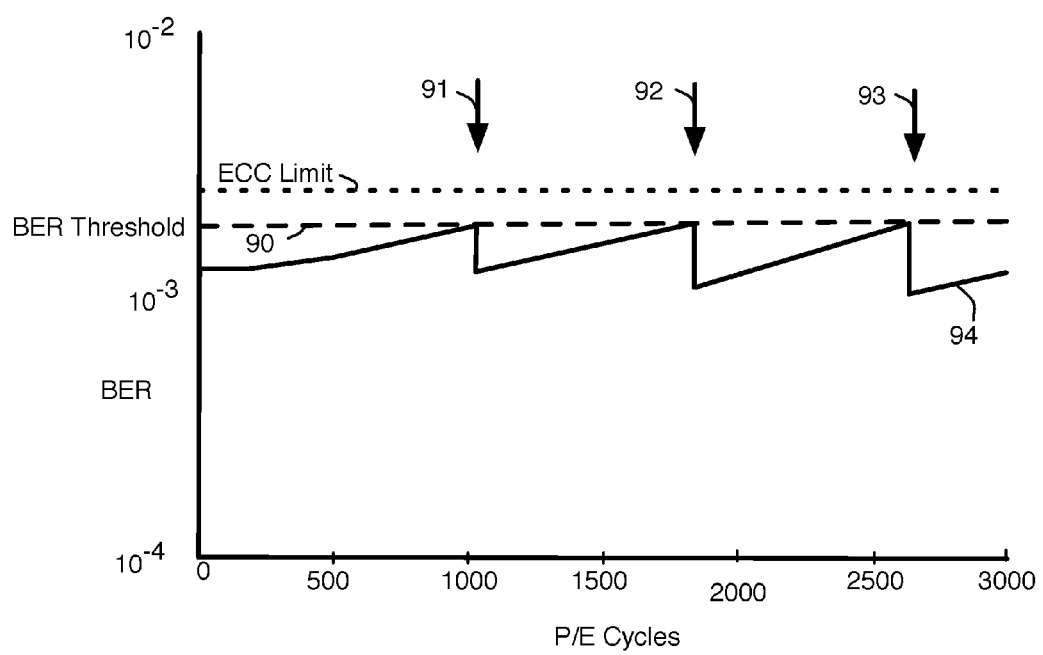
FIG. 5E is a chart of BER vs P/E cycles in accordance with an embodiment of the present invention.

FIG. 5E shows an exemplary embodiment in which an exemplary BER threshold 90 is set at about 90% of the ECC limit. Referring now to BER curve 94, the initial program step voltage is used from the beginning of life until the BER reaches the BER threshold 90 (about 1,000 P/E cycles) at which time a different program step voltage is used as shown by arrow 91 to reduce the BER of the NAND device 25. A different program step voltage is then used until the BER again reaches the BER threshold 90 (about 1,800 P/E cycles) at which time another different program step voltage is used as shown by arrow 92 to again reduce the BER of the NAND device 25. This process continues, with the program step voltage reduced each time that it reaches the BER threshold as shown by arrow 93 until the end of life is reached.

In the previously discussed embodiments the same threshold is used for all pages of each NAND 20 in steps 101, 102 and 106. However, different page types, different topologies, different wordlines and different layers have different bit error rates. In embodiments of the present invention different page types (e.g., lower middle, upper) have different thresholds and/or different block topologies (i.e. different positions within the NAND die) have different thresholds voltages and/or different wordlines (a wordline at the bottom of the NAND string might exhibit different behavior compared to the one at the top) have different thresholds and/or different layers (when dealing with monolithic 3D memories) have different thresholds. When P/E or BER thresholds are used that are not the same for all pages of the NAND 20, the characteristics determined in step 105 need to be identified 105 using the same categorization as that of the characteristic threshold. More particularly, characteristic values can be determined based on the characteristic of the pages and/or blocks being operated on. This can include, for example, storing the number of P/E cycles or BER in all lower pages of a block; storing the number of P/E cycles or BER in all middle pages of a block; storing the number of P/E cycles or BER in all upper pages of a block; and storing number of P/E cycles or BER values based on groupings of wordline number and/or layer number.

In one embodiment the characteristics of NAND devices 20 (e.g., BER or P/E cycles) are determined and are stored (e.g., in data storage 15 or in memory array 23) along with on one or more of the following indexes that indicate characteristics of the page and/or block that is being tested: page type index (lower middle, upper), block topology index, a wordline number index and a layer number index. Thereby, characteristics (e.g., BER or P/E cycles) can be easily determined for a particular page type, block topology, wordline, and/or layer by searching the stored characteristics to identify 105 characteristics having a desired index.

In one embodiment the threshold is a program and erase cycle threshold for each group of blocks. In this embodiment program step circuit 2 is configured to use a program/erase counter to determine the number of program and erase cycles of each block of the NAND device and change the program step voltage of each block in a particular group to the different program step voltage when the determined number of program and erase cycles of the group reaches the program and erase cycle threshold for the group of blocks, which may be, for example blocks 500 to 1,000. The program and erase cycle threshold for the group can be a total number of program and erase cycles for the group, or the average number of program and erase cycles of blocks in the group, etc.

In one embodiment the threshold is a BER threshold for each group of blocks. In this embodiment program step circuit 2 is configured to determine the BER of each group of blocks of the NAND device and change the program step voltage of each block in a particular group to the different program step voltage when the determined BER of the group reaches the BER threshold for the group of blocks, which may be, for example blocks 500 to 1,000. The threshold can be a total BER for the group (e.g., the sum of block BER's for all blocks in the group), or the average BER of blocks in the group, or the greatest number of errors of any page in the group, etc.

In one embodiment the program step voltages that are to be used in steps 103, 107 are determined by analyzing the characteristics of similar NAND devices in a test environment and the program step voltages to be used are stored in data storage 15 or in memory array 23 of a NAND device 20 prior to shipping SSD 1 to a customer. In this embodiment steps 103 and 107 include reading the next program step voltage that is to be used prior to loading the trim register. Alternatively, a mathematical calculation can be used to determine the next program step voltage to be used such as, for example an algorithm based on one or more of the identified characteristics. For example, a mathematical algorithm can be used that reduces the initial program step voltage and the different program by an amount (e.g., a ratio) based on the identified number of program and erase cycles. It is appreciated that any of a number of different methods can be used for determining each subsequent program step voltage.

Figure 6:
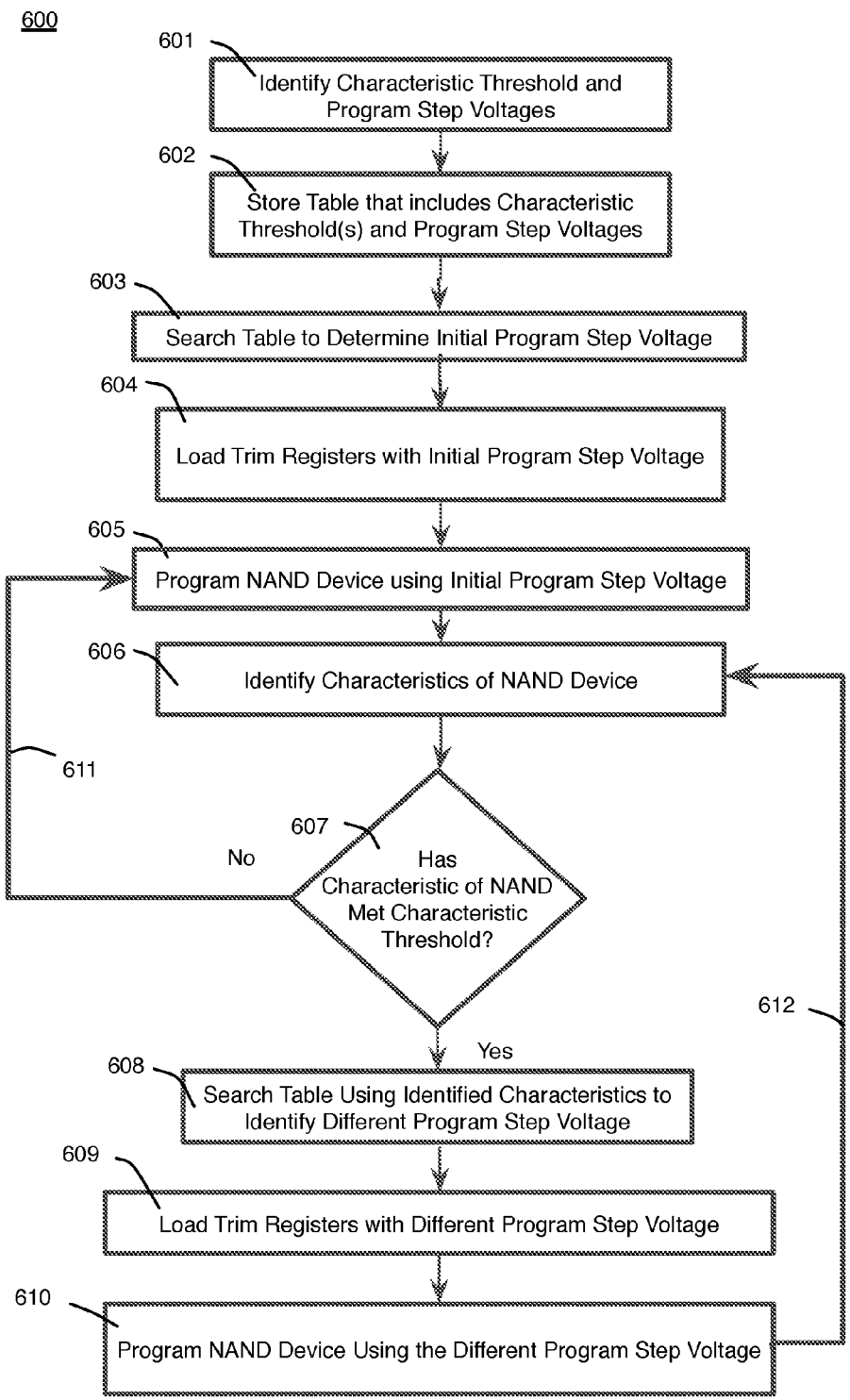
FIG. 6 is a diagram showing a method in which a table is used to store one or more characteristic threshold and program step voltages in accordance with an embodiment of the present invention.

In a method 600 for program step management that is shown in FIG. 6 characteristic threshold(s) and program step voltages are determined 601 by analyzing the characteristics of similar NAND devices in a test environment and the program step voltages to be used are stored 602 in one or more table prior to shipping the SSD 1 to the customer. Nonvolatile memory controller 10 is configured to perform step 602 by storing the one or more table that indicates one or more index value and corresponding program step voltages (the corresponding program step voltages include the initial program step voltage and all different program step voltages). The table can be stored in data storage 15 or in memory array 23 of one or more NAND device 20.

The table is searched 603 to identify the initial program step voltage to be used. The search 603 can also identify one or more characteristic threshold to use.

Trim registers of a NAND device are loaded 604 with an initial program step voltage and program operations of the NAND device are performed 605 using the initial step voltage. Characteristic of the NAND device 20 are identified 105 and one or more characteristic of the NAND device 20 identified in step 605 is compared to the characteristic threshold, and when the characteristic has not met the characteristic threshold the initial program step voltage continues to be used to program the NAND device 20 as shown by line 611. If the characteristic has met the characteristic threshold 607, the table is searched 608 using one or more of the identified characteristics of the NAND device to identify the magnitude of the different program step voltage to be used. In the embodiment shown in FIG. 1 program step circuit 13 is operable to perform step 608 by searching the table with one or more index to identify the corresponding program step voltage to be used. The search 608 can also identify a different characteristic threshold to use.

In one embodiment the index includes a number of P/E cycles and nonvolatile memory controller 10 is configured to determine the number of P/E cycles of the NAND device 20 and use the table to select the program step voltage that corresponds to the determined number of P/E cycles of the NAND device. More particularly, nonvolatile memory controller 10 can search 603 the one or more table to select the program step voltage in the table that corresponds number of P/E cycles of the NAND device identified in step 601.

In another embodiment an index of sequential numbers is used to identify the next program step voltage. In this embodiment a simple counter within program step circuit 13 can be incremented each time that step 604, 609 is performed, and the counter is used to search the table for the next program step voltage to use.

When the characteristic threshold is an error threshold and step 606 includes performing reads of test cells of NAND device 20 during operation of the NAND device 20 to determine the error rate of the NAND device 20, the program step voltage to use in step 604 can be determined by searching 603 the table to identify the initial step voltage. The table is again searched in each step 608 to identify the different program step voltage to be used. The different program step voltage is then loaded 609 into the trim registers of the NAND device 20 and program operations of the NAND device 20 are performed 610 using the different program step voltage. The process of steps 606-610 continues as shown by line 612 during the lifetime of the NAND device 20 with each subsequent program step voltage lower than the previous program step voltage. Thus, the programming step gets smaller as the NAND 20 gets older (i.e. higher number of P/E), reaching the minimum value at the end of life of NAND 20.

In the present embodiment the table indicates both characteristic threshold and the next program step voltage to use. However, it is appreciated that, alternatively a table could be used that only includes indexes and corresponding program step voltages or a table could be used that only includes indexes and corresponding characteristic thresholds.

In the previously discussed embodiments the same program step voltage is used for all pages of each NAND 20 in step 103, 604 and the same program step voltage is used for all pages of each NAND 20 in step 107, 609 that is different from the program step voltage used in step 103. However, in embodiments of the present invention different page types (e.g., lower middle, upper) have different program step voltages and/or different block topologies (i.e. different positions within the NAND die) have different program step voltages and/or different wordlines (a wordline at the bottom of the NAND string might exhibit different behavior compared to the one at the top) have different program step voltages and/or different layers (when dealing with monolithic 3D memories) have different program step voltages. In one such embodiment the table of FIG. 6 includes one or more of the following indexes: a page type index (e.g., lower middle, upper), a block topology index, a wordline number index and a layer number so that different page types, block topologies, wordlines and layers have different program step voltages.

The duration of each programming pulse is independent from the program step voltage. Generally speaking, we are talking about something in the range of 15 µs, to bring the cell to a new "stationary" state (in other words, it is based on the physics of the tunneling phenomena). Therefore, the higher the number of pulses, the longer the time, which means that non-addressed cells are more stressed (by Program Disturb) and more damages can affect the tunnel oxide. If the tunnel oxide gets damaged, it becomes easier for electrons to escape, thus worsening the overall retention time before data corruption. By increasing the programming pulse voltage, the present invention reduces the number of program pulses required to program a cell, reducing programming time as compared to prior art systems that use the same program pulse voltage over the life of the NAND. Given the overall Stress time that a cell can handle during its life, a lower number of pulses, i.e. a shorter programming sequence, leads to a higher number of programming operations that the cell can withstand without going beyond the ECC limit. Accordingly, the methods and apparatus of the present invention shorten programming time, resulting in improved throughput and IOPS for SSD 1. At the same time the overall number of P/E cycles of each NAND device 20 is increased, thus extending the useful lifetime of SSD 1.

The invention claimed is:

1. A nonvolatile memory controller configured to perform program operations and read operations on memory cells of a NAND device, the nonvolatile memory controller including a program step circuit configured to initially program memory cells of the NAND device by loading an initial program step voltage into trim registers of the NAND device and configured to change the program step voltage used to program the memory cells of the NAND device by loading a different program step voltage into the trim registers of the NAND device each time that an error rate of the NAND device reaches an error threshold.

2. The nonvolatile memory controller of claim 1 wherein the nonvolatile memory controller is configured to determine the error rate in lower pages of a block, determine the error rate in middle pages of the block and determine the error rate in upper pages of the block, and is further configured to use the determined error rate in lower pages of the block, the determined error rate in middle pages of the block and the determined error rate in upper pages of the block to determine that an error rate of the NAND device has reached an error threshold.

3. The nonvolatile memory controller of claim 1 further comprising an online test module configured to perform reads of memory cells of the NAND device during operation of the NAND device to determine the error rate of the NAND device.

4. The nonvolatile memory controller of claim 1 wherein the error rate is determined by reading one or more dedicated test block to determine a maximum number of errors in each dedicated test block, the determined maximum number of errors determined to be the error rate of the NAND device.

5. The nonvolatile memory controller of claim 1 wherein the nonvolatile memory controller is configured to store one or more table that indicates one or more index value and corresponding program step voltages, the program step circuit operable to index the table with one or more index to identify a corresponding program step voltage to be loaded into the trim registers of the NAND device as the different program step voltage.

6. The nonvolatile memory controller of claim 1 wherein the error threshold is a bit error rate (BER) threshold, the BER threshold set at 90% of the error correction code (ECC) limit for the NAND device.

7. The nonvolatile memory controller of claim 5 wherein the index comprises one or more of a page type index (lower middle, upper), a block topology index and a wordline number index and a layer number.

8. The nonvolatile memory controller of claim 2 wherein the nonvolatile memory controller is configured to store one or more table that indicates one or more index value and corresponding program step voltages, the program step circuit operable to index the one or more table with a page type index and one or more other index to identify a corresponding program step voltage to be loaded into the trim registers of the NAND device as the different program step voltage.

9. A Solid State Drive (SSD) comprising:
a host connector receptacle for connecting to a host computer;
a plurality of NAND devices;
a nonvolatile memory controller coupled to the host connector receptacle and coupled to each of the plurality of NAND devices, the nonvolatile memory controller configured to perform program operations and read operations on memory cells of each of the NAND devices and wherein the nonvolatile memory controller is configured to load a program step voltage corresponding to a characteristic of a NAND device of the plurality of NAND devices that is to be programmed into a trim register of the NAND device to be programmed, such that the program step voltage is stored in the trim registers of the NAND device to be programmed prior to performing the programming of the NAND device to be programmed; and
wherein the characteristic is an error rate and wherein the nonvolatile memory controller is configured to determine an error rate for each of the NAND devices, configured to determine whether each determined error rate has reached an error threshold, and each time that an error rate is determined to have reached an error threshold, a program step circuit of the nonvolatile memory controller configured to change the program step voltage to be used for programming the NAND device determined to have the error rate that has reached the error threshold to a different program step voltage.

10. A Solid State Drive (SSD) comprising:
a host connector receptacle for connecting to a host computer;
a plurality of NAND devices;
a nonvolatile memory controller coupled to the host connector receptacle and coupled to each of the plurality of NAND devices, the nonvolatile memory controller configured to store a table that indicates one or more index value and corresponding program step voltages, the one or more index value including an error rate and a page type, the nonvolatile memory controller operable to index the table with one or more index value corresponding to an error rate and a page type of the NAND device that is to be programmed to identify the program step voltage of the stored program step voltages and to load the identified program step voltage into a trim register of the NAND device to be programmed such that the identified program step voltage is stored in the trim registers of the NAND device to be programmed prior to performing the programming of the NAND device to be programmed.

11. A method for programming a memory cell of a NAND device comprising:
   loading trim registers of a NAND device with an initial program step voltage;
   performing program operations of the NAND device using the initial program step voltage;
   performing reads of test cells of the NAND device during operation of the NAND device to determine an error rate of the NAND device;
   loading a different program step voltage into the trim registers of the NAND device when the determined error rate of the NAND device reaches an error threshold;
   performing program operations of the NAND device using the different program step voltage; and
   continuing the performing reads, the loading and the performing program operations, wherein the error threshold is set at a value so as to maintain a bit error rate (BER) of the NAND device below an error correction code (ECC) limit of the NAND device.

12. The method of claim 11 further comprising:
   forming a state machine between a nonvolatile memory controller and the NAND device.

13. The method of claim 11 wherein the performing reads of test cells of the NAND device during operation of the NAND device to determine the error rate of the NAND device further comprises reading one or more dedicated test block of the NAND device to determine a maximum number of errors in the dedicated test block, the determined maximum number of errors determined to be the error rate of the NAND device, and further wherein the error threshold is set at a value less than an error correction code (ECC) limit of the NAND device so as to maintain the bit error rate (BER) of the NAND below the ECC limit.

14. The method of claim 13 further comprising:
   storing one or more table that indicates one or more index value and corresponding program step voltages; and
   searching the table using the determined error rate of the NAND device to identify the different program step voltage to be used.

* * * * *